(12) United States Patent
Poiesz et al.

(10) Patent No.: US 10,719,019 B2
(45) Date of Patent: Jul. 21, 2020

(54) SUBSTRATE HOLDER AND A METHOD OF MANUFACTURING A SUBSTRATE HOLDER

(71) Applicants: ASML Netherlands B.V., Veldhoven (NL); ASML Holding N.V., Veldhoven (NL)

(72) Inventors: Thomas Poiesz, Veldhoven (NL); Satish Achanta, Leuven (BE); Mehmet Ali Akbas, Wilton, CT (US); Pavlo Antonov, Valkenburg (UA); Jeroen Bouwknegt, Tilburg (NL); Joost Wilhelmus Maria Frenken, Leiden (NL); Evelyn Wallis Pacitti, Eindhoven (NL); Nicolaas Ten Kate, Almkerk (NL); Bruce Tirri, Brookfield, CT (US); Jan Verhoeven, Kockengen (NL)

(73) Assignees: ASML Holding N.V., Veldhoven (NL); ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/315,125

(22) PCT Filed: Jul. 6, 2017

(86) PCT No.: PCT/EP2017/066890
§ 371 (c)(1),
(2) Date: Jan. 3, 2019

(87) PCT Pub. No.: WO2018/007498
PCT Pub. Date: Jan. 11, 2018

(65) Prior Publication Data
US 2019/0332015 A1    Oct. 31, 2019

(30) Foreign Application Priority Data

Jul. 6, 2016    (EP) .................................... 16178099

(51) Int. Cl.
*G03F 7/20* (2006.01)
*H01L 21/687* (2006.01)

(52) U.S. Cl.
CPC .......... *G03F 7/707* (2013.01); *H01L 21/6875* (2013.01); *H01L 21/68757* (2013.01)

(58) Field of Classification Search
CPC ........ H01J 37/32715; H01J 2237/3321; G03F 7/70716; G03F 7/707; G03F 7/70708;
(Continued)

(56) References Cited

U.S. PATENT DOCUMENTS

| 6,595,506 | B1 | 7/2003 | Zide et al. |
| 2007/0285647 | A1 | 12/2007 | Kwan et al. |

(Continued)

FOREIGN PATENT DOCUMENTS

| CN | 101901777 A | 12/2010 |
| JP | 2007188912 A | 7/2007 |

(Continued)

OTHER PUBLICATIONS

International Search Report as Issued in International Application No. PCT/EP2017/066890.

(Continued)

*Primary Examiner* — Mesfin T Asfaw
(74) *Attorney, Agent, or Firm* — Pillsbury Winthrop Shaw Pittman LLP

(57) ABSTRACT

There is disclosed a substrate holder, a method of manufacturing a substrate holder, a lithographic apparatus comprising the substrate holder, and a method of manufacturing devices using the lithographic apparatus. In one arrangement, there is provided a substrate holder for use in a lithographic apparatus. The substrate holder supports a substrate. The substrate holder comprises a main body. The main body has a main body surface. A plurality of burls are (Continued)

provided projecting from the main body surface. Each burl has a burl side surface and a distal end surface. The distal end surface of each burl engages with the substrate. The distal end surfaces of the burls substantially conform to a support plane and support the substrate. A layer of carbon based material is provided in a plurality of separated regions of carbon based material. The layer of carbon based material provides a surface with a lower coefficient of friction than a part of the main body surface outside the plurality of separated regions of carbon based material. The layer of carbon based material covers only part of the distal end surface of at least one of the burls. Alternatively, the layer of carbon based material covers the distal end surface and at least a portion of the burl side surface of at least one of the burls.

20 Claims, 7 Drawing Sheets

(58) Field of Classification Search
CPC .............. G03F 7/70783; G03F 7/70733; G03F 7/70691; G03F 7/20; G03F 7/70975; G03F 7/70775
See application file for complete search history.

(56) References Cited

U.S. PATENT DOCUMENTS

| | | |
|---|---|---|
| 2008/0138504 A1 | 6/2008 | Williams |
| 2012/0147353 A1 | 6/2012 | Lafarre et al. |
| 2012/0212725 A1 | 8/2012 | Lafarre et al. |
| 2013/0094009 A1 | 4/2013 | Lafarre et al. |
| 2013/0168229 A1 | 7/2013 | Huang et al. |
| 2014/0093336 A1 | 4/2014 | Hiroki |
| 2016/0111318 A1 | 4/2016 | Ichinose |
| 2016/0300746 A1 | 10/2016 | Horiuchi |

FOREIGN PATENT DOCUMENTS

| | | |
|---|---|---|
| JP | 2013102137 A | 5/2013 |
| JP | 2013542590 A | 11/2013 |
| KR | 101063409 B1 | 9/2011 |
| WO | WO 2013/113568 A2 | 8/2013 |
| WO | 2014084060 A1 | 6/2014 |
| WO | WO 2015/076369 A1 | 5/2015 |
| WO | 2015064613 A1 | 7/2015 |
| WO | WO 2017/001135 A1 | 1/2017 |

OTHER PUBLICATIONS

English Translation of Office Action in Taiwan Patent Application No. 106122758 wherein two citations were noted.
Office Action issued in Japanese Patent Application No. 2018-568429, dated Dec. 17, 2019, 4 pages (English-Translation).

SUBSTRATE HOLDER AND A METHOD OF MANUFACTURING A SUBSTRATE HOLDER

CROSS-REFERENCE TO RELATED APPLICATIONS

This application is a 35 U.S.C. 371 National Phase of PCT Application No. PCT/EP2017/066890, filed on Jul. 6, 2017, which claims priority to EP Application No. 16178099.4, filed Jul. 6, 2016, the disclosures of which are hereby incorporated by reference in their entireties.

FIELD

The present invention relates to a substrate holder and a method of manufacturing a substrate holder.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The substrate is clamped onto a substrate holder in the lithographic apparatus when transferring a pattern from the patterning device. A substrate holder conventionally has a plurality of burls to support the substrate. The total area of the burls that contacts the substrate is small compared to the total area of a substrate. Therefore, the chance that a contaminant particle randomly located on the surface of the substrate or the substrate holder is trapped between a burl and the substrate is small. Also, in manufacture of the substrate holder, the tops of the burls can be made more accurately coplanar than a large surface can be made accurately flat.

When a substrate is first loaded onto the substrate holder in preparation for exposure, the substrate is supported by so-called e-pins which hold the substrate at three positions. While the substrate is being held by the e-pins, its own weight will cause the substrate to distort, e.g. becoming convex when viewed from above. To load the substrate onto the substrate holder, the e-pins are retracted so that the substrate is supported by burls of the substrate holder. As the substrate is lowered onto the burls of the substrate holder, the substrate will contact in some places, e.g. near the edge, before other places, e.g. near the center. Friction between the burls and the lower surface of the substrate may prevent the substrate from fully relaxing into a flat unstressed state. Curvature caused by the weight of the substrate when supported on the e-pins is relatively small, due to the rigidity of the substrate. Additionally, some relaxation does occur when the substrate is on the burls of the substrate holder. Nevertheless, the residual curvature can be sufficient to cause undesirable overlay errors. Furthermore, it is possible for the substrate to be non-flat (e.g. warped) even before being supported on the e-pins, which will increase errors.

SUMMARY

It is desirable, for example, to provide an improved substrate holder that can reduce overlay errors.

According to an aspect of the invention, there is provided a substrate holder for use in a lithographic apparatus and configured to support a substrate, the substrate holder comprising:
  a main body having a main body surface;
  a plurality of burls projecting from the main body surface, wherein
    each burl has a burl side surface and a distal end surface, wherein the distal end surface is configured to engage with the substrate;
    the distal end surfaces of the burls substantially conform to a support plane and are configured for supporting the substrate;
  wherein
    a layer of carbon based material is provided in a plurality of separated regions of carbon based material, the layer of carbon based material providing a surface with a lower coefficient of friction than a part of the main body surface outside the plurality of separated regions of carbon based material; and
    the layer of carbon based material covers only part of the distal end surface of at least one of the burls, or the layer of carbon based material covers the distal end surface and at least a portion of the burl side surface of at least one of the burls.

According to an aspect of the invention, there is provided a method of manufacturing a substrate holder, the method comprising:
  providing a substrate holder blank having a main body with a main body surface, and having a plurality of burls projecting from the main body surface, wherein each burl has a burl side surface and a distal end surface, wherein the distal end surface is configured to engage with a substrate and the distal end surfaces of the burls substantially conform to a support plane and are configured for supporting a substrate;
  providing a layer of carbon based material in a plurality of separated regions of carbon based material, the layer of carbon based material providing a surface with a lower coefficient of friction than a part of the main body surface outside the plurality of separated regions of carbon based material, and the plurality of separated regions being positioned such that the layer of carbon based material covers only part of the distal end surface of at least one of the burls, or the layer of carbon based material covers the distal end surface and a portion of the burl side surface of at least one of the burls.

According to an aspect of the invention, there is provided a substrate holder for use in a lithographic apparatus and configured to support a substrate, the substrate holder comprising:
  a main body having a main body surface;
  a plurality of burls projecting from the main body surface, wherein each burl has a burl side surface and a distal end surface, wherein the distal end surface is configured to engage with the substrate;

the distal end surfaces of the burls substantially conform to a support plane and are configured for supporting the substrate;

wherein a continuous layer of carbon based material is provided, the continuous layer comprising a plurality of first regions each having a first thickness and at least one second region having a second thickness, the carbon based material providing a surface with a lower coefficient of friction than the main body surface, the plurality of first regions together either cover only part of the distal end surface of at least one of the burls, or cover the distal end surface and at least a portion of the burl side surface of at least one of the burls, and the first thickness is larger than the second thickness.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
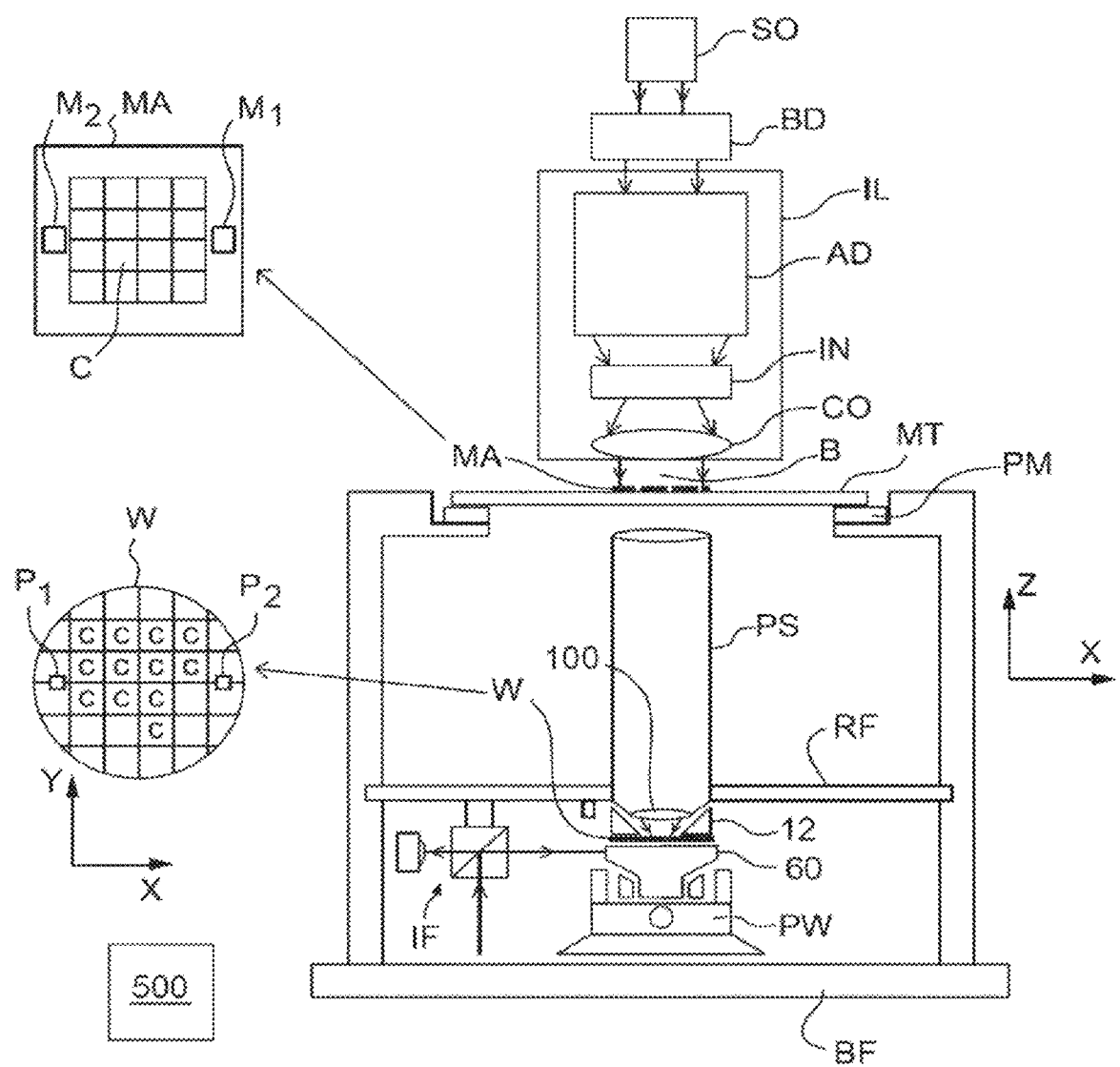
FIG. 1 schematically depicts a lithographic apparatus.

FIG. 1 schematically depicts a lithographic apparatus of an embodiment. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate support apparatus 60 constructed to hold a substrate (e.g. a resist-coated production substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising part of, one, or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate W. It should be noted that the pattern imparted to the radiation beam may not exactly correspond to the desired pattern in the target portion of the substrate W, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the lithographic apparatus is of a transmissive type (e.g. employing a transmissive mask). Alternatively, the lithographic apparatus may be of a reflective type (e.g. employing a programmable mirror array of a type as referred to above, or employing a reflective mask).

The lithographic apparatus may be of a type having two or more tables (or stage(s) or support(s)), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stage(s) or support(s)) which may be used in parallel in a similar manner to substrate, sensor and measurement tables. The lithographic apparatus may be of a type that has a measurement station, at which there are various sensors for characterizing a production substrate prior to exposure and an exposure station, at which the exposures are commanded out.

The lithographic apparatus may be of a type wherein at least a portion of the substrate W may be covered by a immersion liquid having a relatively high refractive index, e.g. water such as ultra pure water (UPW), so as to fill an immersion space 11 between the projection system PS and the substrate W. An immersion liquid may also be applied to other spaces in the lithography apparatus, for example, between the patterning device MA and the projection system PS. Immersion techniques can be used to increase the numerical aperture of projection systems. The term "immersion" as used herein does not mean that a structure, such as a substrate W, must be submerged in immersion liquid; rather "immersion" only means that an immersion liquid is located between the projection system PS and the substrate W during exposure. The path of the patterned radiation beam B from the projection system PS to the substrate W is entirely through immersion liquid. In an arrangement for providing immersion liquid between a final optical element of the projection system PS and the substrate W a liquid confinement structure 12 extends along at least a part of a boundary of an immersion space between the final optical element 100 of the projection system PS and the facing surface of the stage or table facing the projection system PS.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam B to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate support apparatus 60 can be moved accurately, e.g. so as to position different target portions C in the path of the radiation beam B.

Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate support apparatus 60 may be realized using a long-stroke module and a short-stroke module, which form part of the second positioner PW.

In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the patterning device alignment marks M1, M2 may be located between the dies.

The depicted apparatus could be used in at least one of the following modes:

1. In step mode, the support structure MT and the substrate support apparatus 60 are kept essentially stationary, while an entire pattern imparted to the radiation beam B is projected onto a target portion C at one time (i.e. a single static exposure). The substrate support apparatus 60 is then shifted in the X and/or Y direction so that a different target portion C can be exposed. In step mode, the maximum size of the exposure field limits the size of the target portion C imaged in a single static exposure.

2. In scan mode, the support structure MT and the substrate support apparatus 60 are scanned synchronously while a pattern imparted to the radiation beam B is projected onto a target portion C (i.e. a single dynamic exposure). The velocity and direction of the substrate support apparatus 60 relative to the support structure MT may be determined by the (de-) magnification and image reversal characteristics of the projection system PS. In scan mode, the maximum size of the exposure field limits the width (in the non-scanning direction) of the target portion C in a single dynamic exposure, whereas the length of the scanning motion (and size of the exposure field) determines the height (in the scanning direction) of the target portion C.

3. In another mode, the support structure MT is kept essentially stationary holding a programmable patterning device, and the substrate support apparatus 60 is moved or scanned while a pattern imparted to the radiation beam B is projected onto a target portion C. In this mode, generally a pulsed radiation source is employed and the programmable patterning device is updated as required after each movement of the substrate support apparatus 60 or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. One computer can control multiple lithographic apparatuses. Multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab.

The substrate support apparatus 60 comprises a substrate holder WT. The substrate W is conventionally clamped to the substrate holder WT during exposures. Two clamping techniques are commonly used. In vacuum-clamping a pressure differential across the substrate W is established, e.g., by connecting the space between the substrate holder WT and the substrate W to an under-pressure that is lower than a higher pressure above the substrate W. The pressure difference gives rise to a force holding the substrate W to the substrate holder WT. In electrostatic clamping, electrostatic forces are used to exert a force between the substrate W and the substrate holder WT. Several different arrangements are known to achieve this. In one arrangement a first electrode is provide on the lower surface of the substrate W and a second electrode on the upper surface of the substrate holder WT. A potential difference is established between the first and second electrodes. In another arrangement two semi-circular electrodes are provided on the substrate holder WT and a conductive layer is provided on the substrate W. A potential difference is applied between the two semi-circular electrodes so that the two semi-circular electrodes and the conductive layer on the substrate W act like two capacitors in series.

To load a substrate W onto the substrate holder WT for exposures, the substrate W is picked up by a substrate handler robot and lowered onto a set of e-pins. The e-pins project through the substrate holder WT. The e-pins are actuated so that they can extend and retract. The e-pins may be provided with suction openings at their tips to grip the substrate W. The e-pins may comprise three e-pins spaced around the center of the substrate holder WT. Once the substrate W has settled on the e-pins, the e-pins are retracted so that the substrate W is supported by burls of the substrate holder WT. While the substrate W is being held by the e-pins, its own weight will cause the substrate W to distort, e.g. becoming convex when viewed from above. As the substrate W is lowered onto the burls, the substrate W will contact the burls in some places, e.g. near the edge of the substrate holder WT, before other places, e.g. near the center of the substrate holder WT. Friction between the burls and a lower surface of the substrate W may prevent the substrate W from fully relaxing into a flat unstressed state. Although the curvature of the substrate W when supported on the e-pins is small—due to the rigidity of the substrate W—and some relaxation does occur when the substrate W is on the burls of the substrate holder WT, the residual curvature can nonetheless be sufficient to cause undesirable overlay errors.

A layer or coating of diamond-like carbon (DLC) can be provided on a substrate holder WT. The substrate holder WT can be provided with a layer of DLC to improve the interface properties between the substrate holder WT and the substrate W. A layer of DLC on the substrate holder WT reduces friction in directions parallel to the support plane of the substrate holder WT (and, therefore, parallel to the surface of the substrate W). The layer of DLC can reduce the coefficient of friction between the burls and the substrate W by a factor of about 2 compared to burls made of SiSiC. This allows the substrate W to fully relax when placed on the substrate holder WT. This reduces overlay errors. Coating a substrate holder WT with DLC has the additional advantage of increasing the lifetime of the substrate holder WT. The hardness and toughness of the layer of DLC reduce wear of the substrate holder WT when in physical contact with a substrate W.

The layer of DLC is one example of a layer of carbon based material that can be provided on a substrate holder WT to reduce friction (and thereby reduce overlay error) and/or to reduce wear of the substrate holder WT. Embodiments of the present invention will be described with specific reference to DLC. However, any other carbon based material having a lower coefficient of friction than the main body of the substrate holder WT may be used additionally or instead of DLC in alternative embodiments. Such a carbon based material may be a solid and/or inorganic carbon based material. The carbon based material may have a higher resilience to wear than the main body of the substrate holder WT. The carbon based material may comprise graphene. For example, the carbon based material may be selected from the group consisting of: diamond-like carbon, graphene, graphite, tetrahedral amorphous carbon (ta-C), amorphous carbon (a-C), amorphous carbon with integrated tungsten (a-C:W), tetrahedral amorphous carbon with integrated tungsten (ta-C:W), hydrogenated amorphous carbon (a-C:H), tetrahedral hydrogenated amorphous carbon (ta-C:H), hydrogenated amorphous carbon with integrated tungsten (a-C:H:W), tetrahedral hydrogenated amorphous carbon with integrated tungsten (ta-C:H:W), hydrogenated amorphous carbon with silicon doping (a-C:H:Si), tetrahedral hydrogenated amorphous carbon with silicon doping (ta-C:H:Si), hydrogenated amorphous carbon with fluorine doping (a-C:H:F), tetrahedral hydrogenated amorphous carbon with fluorine doping (ta-C:H:F), ultra nanocrystalline diamond (UNCD), diamond, tungsten carbides, chromium carbides, titanium carbides, $Cr_2C$/a-C:H, graphite/TiC/Ti alloys, and multiwall carbon nanotubes (MWCNT) incorporated in alumina. Each of these carbon based materials demonstrates a high resilience to wear and low friction properties. In the embodiments described below, any one of these specific carbon based materials may be used instead of or in addition to DLC.

The inventors have identified that a layer of carbon based material, such as a layer of DLC, provided on a substrate holder WT gives rise to high internal compressive stresses. These internal stresses are due to the production process and the material properties of carbon based materials such as DLC. The internal stresses in, for example, the layer of DLC can lead to deformation of the substrate holder WT. The deformation may comprise bending of the substrate holder WT, curling of the substrate holder WT, or other deformations. The inventors have performed measurements on a typical substrate holder WT coated with a 1 μm thick layer of DLC, and found a global peak-valley deformation of the order of 2.5 micrometers. This deformation can be partly suppressed by clamping the substrate W and substrate holder WT against the second positioner PW. However, an outer edge of the substrate holder WT may not be supported by the clamp system. Deformation of the outer edge of the substrate holder WT due to the internal stresses of the DLC layer can thus not be suppressed. In measurements on a typical substrate holder WT the inventors have found that this effect led to a 150 nm to 200 nm curl down of the outer edge. As a result, the outer edge may be out of the focus of the lithographic apparatus. One possibility to compensate for the global deformation of the substrate holder WT is to correct the flatness of the substrate holder WT after the layer of DLC has been applied. However, this approach requires extensive and expensive post-processing. Even if such post-processing was applied, the flatness requirement for many lithographic processes would not be met.

Figure 2:
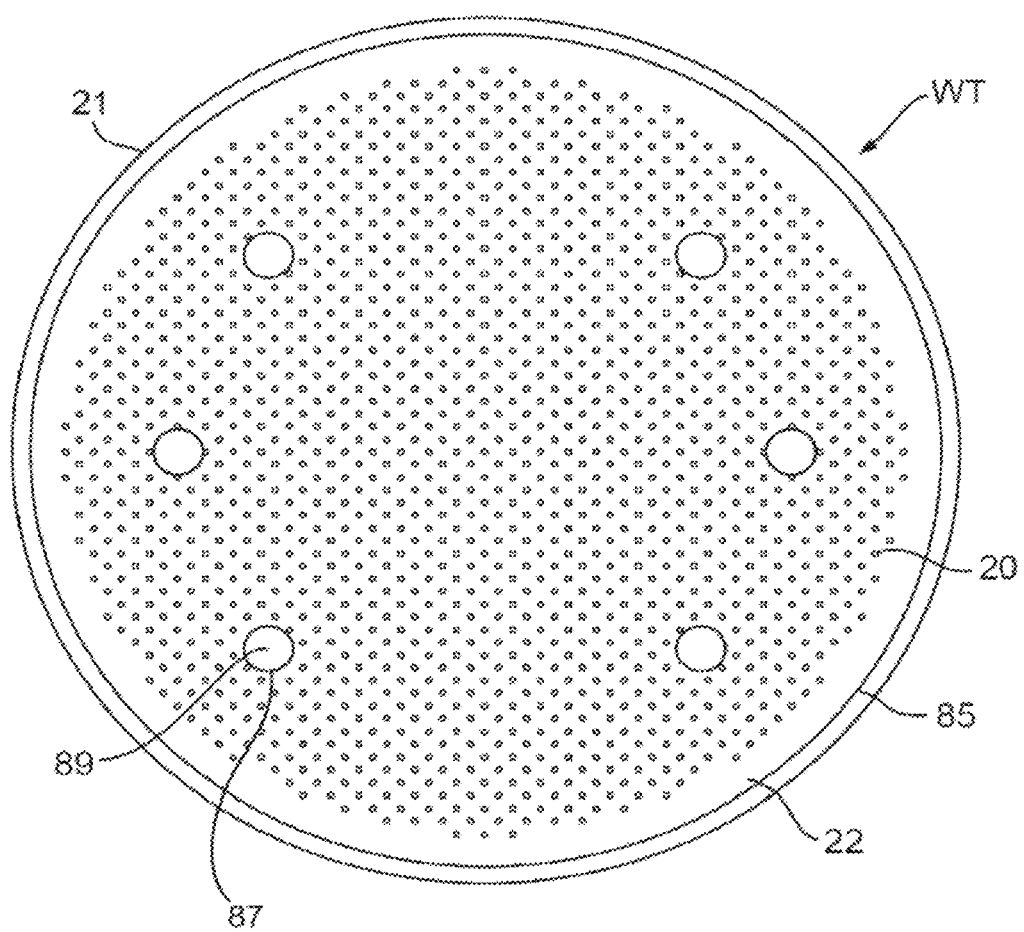
FIG. 2 depicts in plan a substrate holder according to an embodiment.

FIG. 2 depicts a substrate holder WT for use in a lithographic apparatus according to an embodiment. The substrate holder WT supports a substrate W. The substrate holder WT comprises a main body 21. The main body 21 has a main body surface 22. A plurality of burls 20 are provided projecting from the main body surface 22. The distal end surface 20a of each burl 20 engages with the substrate W. The distal end surfaces 20a of the burls 20 substantially conform to a support plane and support the substrate W. Main body 21 and burls 20 may be formed of SiSiC, a ceramic material having silicon carbide (SiC) grains in a silicon matrix. Alternatively, main body 21 and burls 20 may be formed of SiC.

A plurality of through-holes 89 may be formed in the main body 21. Through-holes 89 allow the e-pins to project through the substrate holder WT to receive the substrate W. Through-holes 89 may allow the space between a substrate W and the substrate holder WT to be evacuated. Evacuation of the space between a substrate W and the substrate holder WT can provide a clamping force, if the space above the substrate W is not also evacuated. The clamping force holds the substrate W in place. If the space above the substrate W is also evacuated, as would be the case in a lithographic apparatus using EUV radiation, electrodes can be provided on the substrate holder WT to form an electrostatic clamp.

In an embodiment, the substrate holder WT further comprises a seal 87. The seal 87 may project from the main body surface 22. The seal 87 may have a seal end surface. The seal 87 may surround a through-hole 89. The seal end surface may form a continuous ring around the through-hole 89. In other embodiments, the seal 87 may have any other shape that surrounds the through-hole 89. The height of the seal 87 may be substantially equal to the height of the burls 20, such that the seal end surface conforms to the substantially flat support plane defined by the distal end surfaces 20a of the burls 20. The seal 87 may contact the substrate W when the substrate W rests on the burls 20 of the substrate holder WT. A seal 87 may contact the substrate W such that fluid communication between a through-hole 89 and the area external to the seal 87 is prevented. By applying an under-pressure to the through-holes 89 that is lower than a pressure above the substrate W, the substrate W may be clamped to the substrate holder WT. Alternatively, the seal 87 may have a height slightly shorter than that of the burls 20 so that the seal 87 does not contact the substrate W. Such a seal 87 reduces the gas flow into the through holes 89 so as to give rise to an under-pressure. Optionally, or alternatively, an edge seal 85 may be provided near the periphery of substrate holder WT. Edge seal 85 is a projecting ridge around the outside of substrate holder WT. Edge seal 85 may have a height slightly shorter than that of the burls 20 and reduces the gas flow into the space between the substrate W and substrate holder WT, so as to provide a clamping force.

Other structures, for example to control gas flow and/or thermal conductivity between the substrate holder WT and the substrate W, can be provided. The substrate holder WT can be provided with electronic components. Electronic components may comprise heaters and sensors. Heaters and sensors may be used to control the temperature of the substrate holder WT and substrate W.

Figure 3:
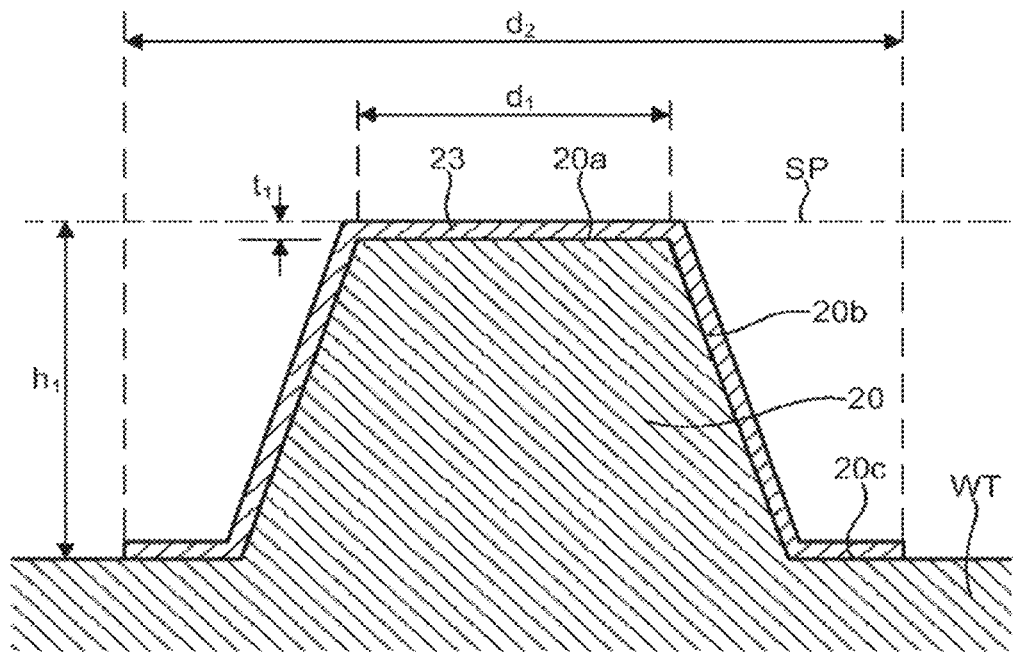
FIG. 3 depicts in cross-section a burl of a substrate holder according to an embodiment.

A burl 20 is shown enlarged in FIG. 3. In an embodiment, each burl 20 has a burl side surface 20b and a distal end surface 20a. Burl 20 may have a height $h_1$ in the range of from 100 μm to 500 μm, e.g. about 150 μm. The diameter $d_1$ of the distal end surface 20a of burl 20 may be in the range of 100 μm to 300 μm, e.g. about 200 μm. The pitch of the burls 20 may be in the range of about 0.5 mm to 3 mm, e.g. about 1.5 mm. The pitch of the burls 20 is the distance between the centers of two adjacent burls 20. In an embodiment, the total area of the distal end surfaces 20a of all the burls 20 is in the range of from 1% to 3% of the total area of a substrate W or the substrate holder WT. Indicated in FIG. 3, burls 20 may be frusto-conical in shape, with burl side surfaces 20b being slightly inclined. In an embodiment, the burl side surfaces 20b may be vertical or even overhanging. In an embodiment, burls 20 are circular in plan. Burls 20 can also be formed in other shapes if desired.

In an embodiment, a layer of DLC is provided. In alternative embodiments, a layer of carbon based material other than DLC is provided. The layer of DLC or other carbon based material is provided in a plurality of separated regions 23 of carbon based material (e.g. DLC). In an embodiment, the layer of carbon based material (e.g. DLC) covers the distal end surface 20a and a portion of the burl side surface 20b of a burl 20. The layer of carbon based material (e.g. DLC) is provided on the distal end surfaces 20a of the burls 20 to reduce overlay errors. In practice, fabrication methods may not be so accurate as to allow for only the distal end surface 20a (and not the burl side surface 20b) of the burl 20 to be covered. By aiming to exactly cover the distal end surface 20a of the burl 20, there is a risk that the layer of carbon based material (e.g. DLC) simply overlaps with (rather than completely covers) the distal end surface 20a. This is due to inaccuracies of available fabrication methods. Covering at least a portion of the burl side surface 20b with carbon based material (e.g. DLC) allows for a margin of inaccuracy in the provision of the layer of carbon based material (e.g. DLC). This makes fabrication of the layer of carbon based material (e.g. DLC) easy and cheap. A further advantage of covering a portion of the burl side surface 20b in addition to the distal end surface 20a of the burls 20 is that the adhesion of the layer of carbon based material (e.g. DLC) to the burl 20 is improved. This reduces the risk of separation of the layer of carbon based material (e.g. DLC) from the burls 20.

In another embodiment, the layer of carbon based material covers only part of (not all of) the distal end surface 20a of the burl 20. This is advantageous, for example, if the carbon based material can be provided more easily, or attaches preferably, to specific regions on the distal end surface 20a of the burls 20. A burl formed of SiSiC comprises SiC grains in a silicon matrix. Carbon based materials, for example graphene, may adhere better to the SiC grains than to the silicon matrix. Furthermore, carbon based materials, for example graphene, may be grown selectively on the SiC grains, and not the silicon matrix. The part of the distal end surface 20a of the burl 20 that is covered by the carbon based material may be a SiC grain on the distal end surface 20a of the burl 20. Covering only part of the distal end surface 20a of the burl 20 may make fabrication of the layer of carbon based material easier and/or cheaper.

The layer of carbon based material (e.g. DLC) may be provided on the portion of the burl side surface 20b directly adjacent to the distal end surface 20a of the burl 20. In other words, the carbon based material (e.g. DLC) that is provided on the portion of the burl side surface 20b may completely surround the distal end surface 20a of the burl 20. In some embodiments, the layer of carbon based material (e.g. DLC) covers the burl side surface 20b, the distal end surface 20a, and a portion of the main body surface 22. The layer of carbon based material (e.g. DLC) may cover the portion of the main body surface 22 directly adjacent to the burl side surface 20b. This further increases the margin for inaccuracies using available fabrication methods. Fabrication of the layer of carbon based material (e.g. DLC) may thus be easier and less expensive. The adhesion of the layer of carbon based material (e.g. DLC) to the burl 20 is further improved. Providing the carbon based material (e.g. DLC) to regions other than the distal end surface 20a of the burls 20 may also improve the resilience to wear of these regions, thereby improving substrate holder lifetime.

In some embodiments, the layer of carbon based material (e.g. DLC) covers the seal end surface of a seal 87. The layer of carbon based material (e.g. DLC) may additionally be provided on the distal end surfaces of any other features projecting from the main body surface 22. The layer of carbon based material (e.g. DLC) may be provided on any other components that can contact the substrate W. The layer of carbon based material (e.g. DLC) may be provided locally to the main body surface 22 to improve passive water management on the substrate holder WT. The layer of carbon based material (e.g. DLC) may be provided locally to the main body surface 22 to make cleaning the substrate holder WT easier.

In some embodiments, the layer of carbon based material (e.g. DLC) is provided on all burls 20 of the substrate holder WT. The layer of carbon based material (e.g. DLC) may cover the distal end surface 20a of each of (i.e. all of) the plurality of burls 20 projecting from the main body surface 22. The overall reduction in friction is therefore maximized. Overlay errors are minimized. However, it is possible that the layer of carbon based material (e.g. DLC) is provided only to certain burls 20. For example, the layer of carbon based material (e.g. DLC) may be provided only to burls 20 in a central region of the substrate holder WT. In an embodiment, the layer of carbon based material (e.g. DLC) further covers at least part of the burl side surface 20b of each of the plurality of burls 20 projecting from the main body surface 22.

The layer of carbon based material (e.g. DLC) is provided in a plurality of separated, or disconnected, regions 23 of carbon based material (e.g. DLC). The layer of carbon based material (e.g. DLC) may be made up of, or consist of, the plurality of separated regions 23 of carbon based material (e.g. DLC). None of the separated regions 23 of carbon based material (e.g. DLC) connects to or is in contact with another one of the separated regions 23 of carbon based material (e.g. DLC). The provision of the layer of carbon based material (e.g. DLC) in a plurality of separated regions 23 of carbon based material (e.g. DLC) reduces the impact of internal stresses in the carbon based material (e.g. DLC) on the substrate holder WT. This reduces the overall deformation of the substrate holder WT that arises from internal stresses in the carbon based material (e.g. DLC), compared to the deformation that would arise if a single continuous layer of carbon based material (e.g. DLC) was provided.

Each of the separated regions 23 of carbon based material (e.g. DLC), or each of the separated regions 23 of carbon based material (e.g. DLC) that is provided on a burl 20, may comprise substantially the same features and dimensions. Alternatively, the separated regions 23 of carbon based material (e.g. DLC) may differ from each other. A separated region 23 of carbon based material (e.g. DLC) may be provided on the distal end surface 20a and a portion of the burl side surface 20b of a burl 20. A separated region 23 of carbon based material (e.g. DLC) may cover the entire burl side surface 20b and a portion 20c of the main body surface 22 directly adjacent to the burl side surface 20b. One or more separated regions 23 of carbon based material (e.g. DLC) may be provided on the distal end surfaces of seals 87. One or more separated regions 23 of carbon based material (e.g. DLC) may be provided on any other features projecting from the main body surface 22. A separated region 23 of carbon based material (e.g. DLC) may be circular when viewed in plan. Alternatively, a separated region 23 of carbon based material (e.g. DLC) may be formed in other shapes.

In an embodiment, each of one or more of the plurality of separated regions 23 of carbon based material (e.g. DLC) covers a portion of the burl side surface 20b and the distal end surface 20a of a single burl 20 (i.e. one and only one burl 20). This limits the lateral dimension of the separated regions 23 of carbon based material (e.g. DLC), thereby decreasing the deformation of the substrate holder WT arising from internal stresses in the carbon based material (e.g. DLC). Each of the separated regions 23 of carbon based material (e.g. DLC) may cover the distal end surface 20a of a single burl 20. In other words, each of the separated regions 23 of carbon based material (e.g. DLC) may only be provided on one burl 20, but not a second burl 20. Each of the separated regions 23 of carbon based material (e.g. DLC) that is provided on a burl 20 may cover the distal end surface 20a of a single burl 20. Alternatively, each of one or more of the plurality of separated regions 23 of carbon based material (e.g. DLC) may be provided on multiple burls 20, for example a group of adjacent burls 20.

A separated region 23 of carbon based material (e.g. DLC) may have a minimum lateral dimension, or diameter $d_2$, when viewed perpendicularly to the main body surface 22, that is greater than the diameter $d_1$ of the distal end surface 20a of a burl 20. In an embodiment, each of the separated regions 23 of carbon based material (e.g. DLC) that covers a portion of the burl side surface 20b and the distal end surface 20a of a single burl 20 has, when viewed perpendicularly to the main body surface 22, a maximum lateral dimension, or diameter $d_2$, that is less than the distance between the center of the burl 20 and the center of a nearest other burl 20. A separated region 23 of carbon based material (e.g. DLC), that is provided on a burl 20, may extend up to a point that is halfway between the center of that burl 20 and the center of a nearest other burl 20. For example, a separated region 23 of carbon based material (e.g. DLC) may have a diameter $d_2$, or average lateral dimension, when viewed in plan, in the range from 100 μm to 2 mm, or preferably in the range from 200 μm to 500 μm. Limiting the lateral dimensions of the separated regions 23 of carbon based material (e.g. DLC) decreases deformation of the substrate holder WT.

In an embodiment, the layer of carbon based material comprises a layer of DLC and has a thickness in the range from 0.5 μm to 1.5 μm. As such, the separated regions 23 of DLC that make up the layer of DLC have a thickness $t_1$ in the range from 0.5 μm to 1.5 μm. A minimum thickness of 0.5 μm allows for the layer of DLC to be processed after deposition, for example to improve the flatness of the top surface of the layer of DLC. Post-processing can ensure that the top surface of the layer of DLC accurately conform to the support plane SP. A minimum thickness of 0.5 μm further allows for any minor local depressions or projections to be levelled out. A maximum thickness of 1.5 μm ensures that the internal compressive stresses in the layer of DLC are kept low. In other embodiments the layer of carbon based material comprises a carbon based material other than DLC and also has a thickness in the range from 0.5 μm to 1.5 μm. This may provide the same advantages as described in relation to DLC.

In an alternative embodiment, a thinner layer of DLC, as an example of a carbon based material, is provided, optionally thin enough to substantially follow the surface underlying the layer of DLC. In an embodiment the layer of DLC has a thickness in the range of from 30 nm to 200 nm. In this case the separated regions 23 of DLC that make up the layer of DLC have a thickness $t_1$ in the range from 30 nm to 200 nm. Providing such a thin layer of DLC further reduces internal compressive stresses in the layer of DLC. Layers of other carbon based materials may also have a thickness in the range from 30 nm to 200 nm. This further reduces the internal compressive stresses in the layer of carbon based material.

The exact formulation of the layer of DLC, as an example of a layer of carbon based material, can be selected to achieve desired properties (e.g. hydrogen content in amorphous hydrogenated carbon, a:C—H, or tetrahedral amorphous carbon, ta-C). Desired properties may include, for example, adhesion to the material of the main body 21, mechanical strength, robustness and coefficient of friction to the substrate W. Suitable additives that can be included in the layer of DLC include silicon, oxygen, nitrogen, molybdenum and fluorine. If the main body 21 of substrate holder WT and burls 20 are formed of SiSiC or SiC, then inclusion of silicon in the layer of DLC can improve adhesion to the substrate holder WT. In an embodiment, an adhesion promoting layer can be provided between burl surfaces 20a, 20b and the layer of DLC. Addition of fluorine to the layer of DLC can further reduce friction. The exact formulation of a layer made of other carbon based materials may also be selected to achieve such desired properties.

In an embodiment, the layer of DLC reduces the friction between the substrate holder WT and a substrate W by a factor of about 2, compared to a substrate holder WT of SiSiC without the layer of DLC but otherwise similar in all respects. In an embodiment, the coefficient of friction, defined as a ratio of normal force to pulling force, can be about 0.1. The coefficient of friction can be measured by placing a piece of substrate W on the substrate holder WT and measuring the force required to drag the substrate W across the substrate holder WT. The normal force is desirably of the order of mN and can be provided through the weight of the piece of substrate W, additional weights placed on top of the substrate W or a pressure difference across it. The ambient humidity can have an effect on measurement of the coefficient friction so the measurement is desirably performed with relative humidity RH in the range of from 30° to 70°. Other carbon based material can also significantly reduce the friction between a substrate holder WT and a substrate W.

An additional advantage of the layer of DLC is that DLC is less stiff than SiSiC. In an embodiment, the layer of DLC has a stiffness about 70% less than pure SiSiC. This decreased stiffness of DLC, in combination with the high hardness of DLC, can improve the resilience to wear of the substrate holder WT. Other carbon based materials also improve the resilience to wear of the substrate holder WT.

In an embodiment, the plurality of separated regions 23 of carbon based material (e.g. DLC) are formed by selectively removing regions of carbon based material (e.g. DLC) from a previously deposited layer of carbon based material (e.g. DLC). By forming the plurality of separated regions 23 of carbon based material (e.g. DLC) from a single continuous carbon based material layer (e.g. DLC) it is ensured that the thickness and properties of each of the separated regions 23 of carbon based material (e.g. DLC) are constant. This ensures that the top surfaces of the layer of carbon based material (e.g. DLC) on the distal end surfaces 20a of the burls 20 conform to a substantially flat support plane SP.

Figure 4:
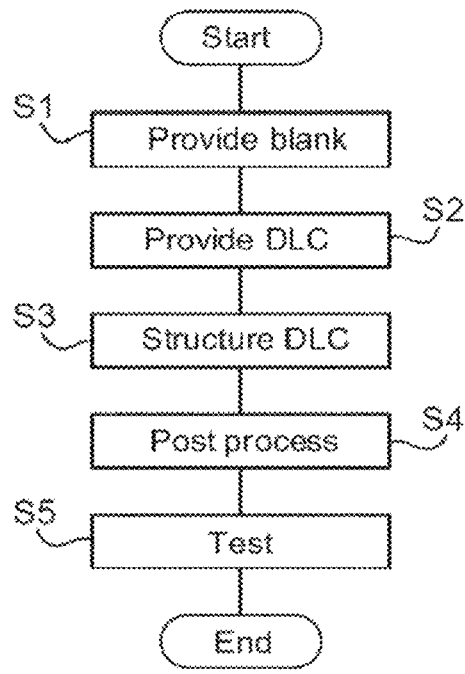
FIG. 4 depicts a method of manufacturing a substrate holder according to an embodiment.

FIG. 4 depicts a method of manufacturing a substrate holder WT according to an embodiment. In a first step S1, a substrate holder blank, or template, is provided. The substrate holder blank may be made of SiSiC. The substrate holder blank has a main body 21. The main body 21 has a main body surface 22. The substrate holder blank has a plurality of burls 20 projecting from the main body surface 22. Each burl 20 has a burl side surface 20b and a distal end surface 20a. The distal end surfaces 20a of the burls 20 substantially conform to a support plane and support the substrate W. The distal end surface 20a of each burl 20 engages with a substrate W. Alternatively, a substrate holder blank may be fabricated in a first step using known fabrication methods.

The method further comprises providing a layer of carbon based material (e.g. DLC) in a plurality of separated regions 23 of carbon based material (e.g. DLC). The plurality of separated regions 23 of carbon based material (e.g. DLC) are positioned such that the layer of carbon based material (e.g. DLC) covers the distal end surface 20a and a portion of the burl side surface 20b of the burls 20.

In an embodiment, the layer of carbon based material (e.g. DLC) is provided by first providing S2 a single, continuous layer of carbon based material (e.g. DLC) on the main body surface 22 and the plurality of burls 20. It is possible that the continuous layer of carbon based material (e.g. DLC) is provided S2 only to certain burls 20, such as burls 20 in a central region of the substrate holder WT. Alternatively, the continuous layer of carbon based material (e.g. DLC) may be provided S2 to the whole of substrate holder WT. The continuous layer of carbon based material (e.g. DLC) may, for example, be provided to the substrate holder WT using a plasma deposition process.

Next, regions of carbon based material (e.g. DLC) are selectively removed S3 from the continuous layer of carbon based material (e.g. DLC), so as to form the plurality of separated regions 23 of carbon based material (e.g. DLC). In other words, the continuous layer of carbon based material (e.g. DLC) is patterned, structured or interrupted. The plurality of separated regions 23 of carbon based material (e.g. DLC) may have features and properties as described above. Selective removal S3 of carbon based material (e.g. DLC) may be achieved by etching or abrasive sand blasting through a mask (consisting, for example, of a photoresist or a metal), or electro-discharge machining, but is not limited to these methods.

In an alternative embodiment, steps S2 and S3 are replaced by processing in which the layer of carbon based material (e.g. DLC) is provided while preventing the layer of carbon based material (e.g. DLC) from forming on regions other than the plurality of separated regions 23 of carbon based material (e.g. DLC), thereby forming the plurality of separated regions 23 of carbon based material (e.g. DLC). For example, the regions other than the plurality of separated regions 23 of carbon based material (e.g. DLC) may be masked during deposition of the layer of carbon based material (e.g. DLC).

In an optional further step S4, the separated regions 23 of carbon based material (e.g. DLC) may undergo post processing. Post-processing may be used to ensure that the upper surface of the separated regions 23 of carbon based material (e.g. DLC) has a desired flatness and conforms accurately to the support plane SP. The post-processing step S3 may involve selective removal of material, for example by laser ablation, ion etching, or ion-beam figuring (IBF). After post-processing, the substrate holder WT is tested S5 and may be reworked, for example by using oxygen plasma treatment or mechanical polishing, if necessary.

An advantage of first providing S2 a single, continuous layer of carbon based material (e.g. DLC) is that such a layer can be deposited very uniformly, leading to a constant thickness and internal structure throughout the continuous layer of carbon based material (e.g. DLC). As a result, after selective removal S3 of carbon based material (e.g. DLC), or patterning of the continuous layer of carbon based material (e.g. DLC), the remaining separated regions 23 of carbon based material (e.g. DLC) all have substantially equal properties and thicknesses. This ensures that the top surfaces of the separated regions 23 of carbon based material (e.g. DLC) all conform to the same substantially flat support plane SP. This minimizes the requirement for post-processing.

Alternatively, the separated regions 23 of carbon based material (e.g. DLC) may be formed by depositing carbon based material (e.g. DLC) onto the blank or template through a mask, such that the carbon based material (e.g. DLC) is provided to the substrate holder WT in a plurality of separated regions 23 of carbon based material (e.g. DLC). The mask may be reusable. Alternatively, the mask may consist of a sacrificial layer of, for example, a photoresist or a metal.

In an embodiment, a lithographic apparatus for projecting an image onto a substrate W is provided. The lithographic apparatus comprises a substrate holder WT as described above.

In an embodiment, the lithographic apparatus further comprises a support structure MT configured to support a patterning device MA. A projection system PS projects a beam patterned by the patterning device MA onto the substrate W. A clamp system clamps the substrate W to the substrate holder WT.

In an embodiment, there is provided a method of manufacturing devices using a lithographic apparatus. The lithographic apparatus has the substrate holder WT as described above and a clamp system for clamping a substrate W to the substrate holder WT. The method comprises loading a substrate W onto the substrate holder WT. The method further comprises allowing a deformation of the substrate W to relax. The method further comprises engaging the clamp system. The method further comprises exposing a pattern onto the substrate W.

By allowing the deformation of the substrate W to relax before engaging the clamp, overlay errors can be minimized. The layer of carbon based material (e.g. DLC) allows the relaxation to occur without any delay.

Figure 5:
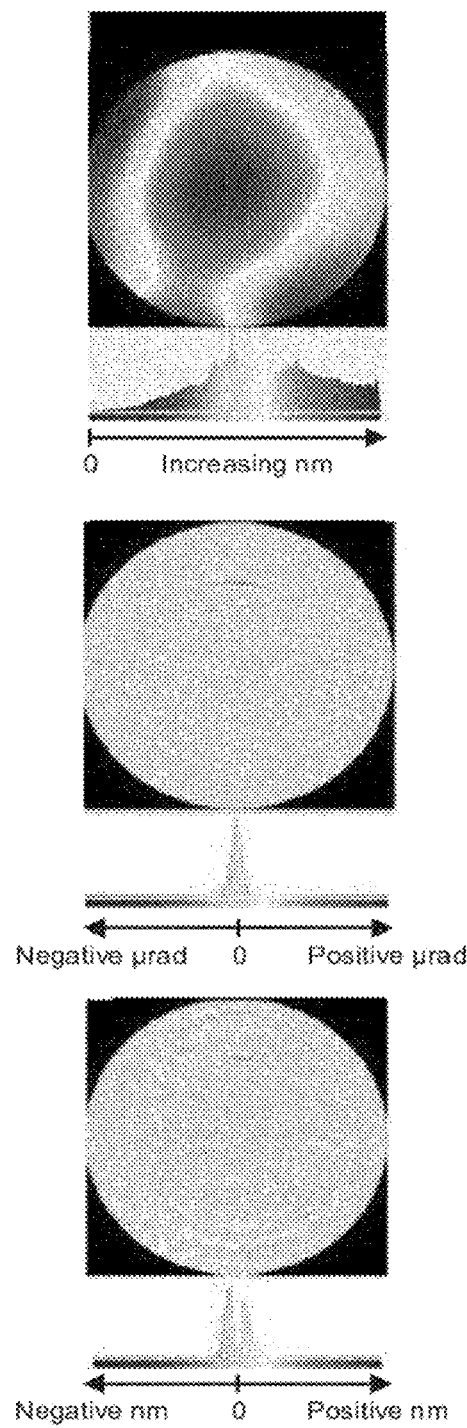
FIG. 5 depicts, top to bottom, three different plots of experimental data showing variation of flatness with position over the substrate holder prior to coating with diamond-like carbon: (top) deviation in global clamped shape; (middle) overlay non-correctible component of substrate holder flatness; (bottom) focus non-correctible component of substrate holder flatness.
Figure 6:
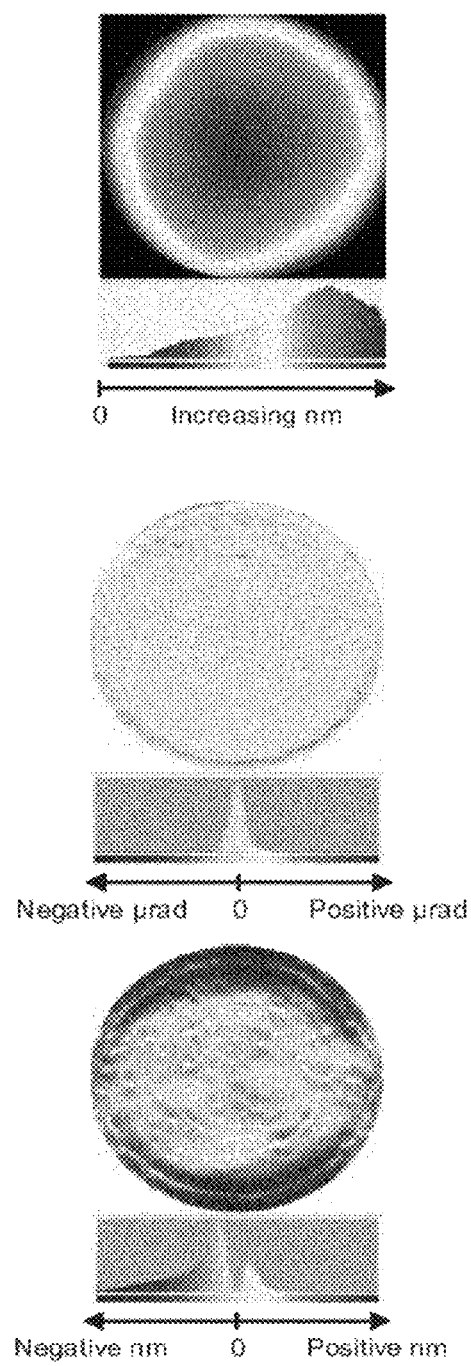
FIG. 6 depicts, top to bottom, three different plots of experimental data showing variation of flatness with position over the substrate holder after coating with a single continuous layer of diamond-like carbon: (top) deviation in global clamped shape; (middle) overlay non-correctible component of substrate holder flatness; (bottom) focus non-correctible component of substrate holder flatness.
Figure 7:
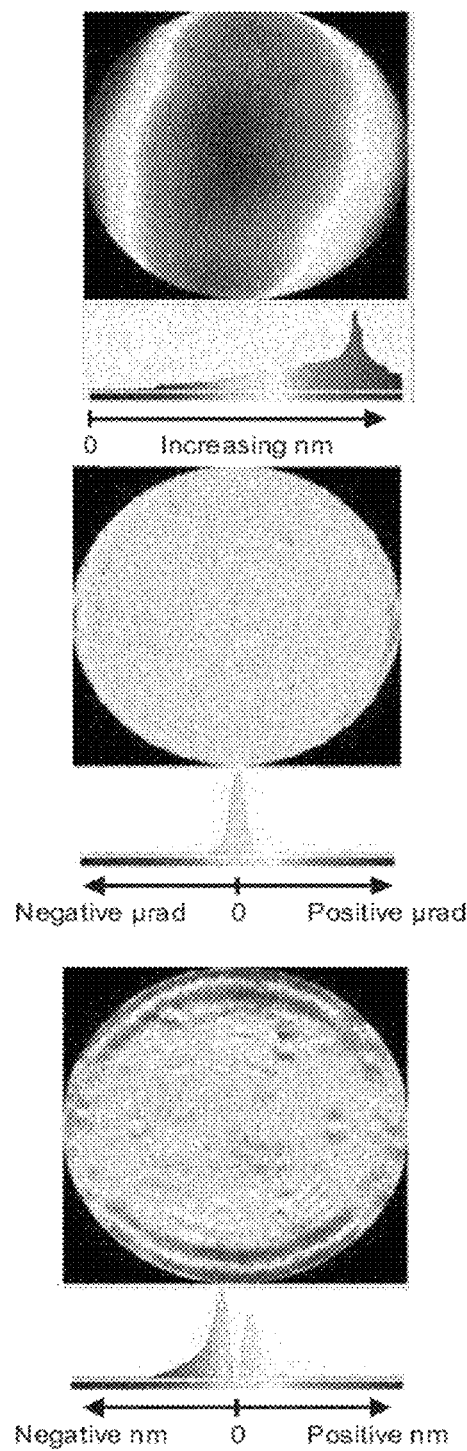
FIG. 7 depicts, top to bottom, three different plots of experimental data showing variation of flatness with position over the substrate holder after the substrate holder has been provided with a plurality of separated regions of diamond-like coating: (top) deviation in global clamped shape; (middle) overlay non-correctible component of substrate holder flatness; (bottom) focus non-correctible component of substrate holder flatness.

FIGS. 5-7 depict experimental data illustrating how improved substrate holder WT flatness is obtained by using separated regions 23 of DLC instead of a single continuous layer of DLC. Each figure comprises three plots of experimental data showing deviations in flatness of the substrate holder WT according to three different measures: (top) deviation in global clamped shape; (middle) overlay non-correctible component of substrate holder flatness; and (bottom) focus non-correctible component of substrate holder flatness. A histogram showing the distribution of pixels over the different levels of deviation and a shading key is provided beneath each plot. In the top plot in each of FIGS. 5-7, the central darker region represents relatively large deviations, the lighter grey regions represent intermediate deviations, and the peripheral darker regions represent relatively small deviations. In the middle plot in each of FIGS. 5-7, most of the plot corresponds to relatively small deviation (corresponding to the shade of the peak in the histogram provided beneath the plot). In the bottom plot in each of FIGS. 5-7, most of the plot corresponds to relatively small deviation (corresponding to the shade of the twin peaked region of the histogram beneath the plot), but darker regions represent relatively large deviations. FIGS. 5-7 show that application of a single continuous layer of DLC leads to relatively large deviations from flatness, recognizable most clearly by comparing the bottom plot of FIG. 6 (after coating with the single continuous layer) with the bottom plot of FIG. 5 (before coating). Structuring the continuous layer of DLC to provide separated regions 23 of DLC reduces the deviations from flatness significantly, recognizable most clearly by comparing the bottom plot of FIG. 6 (after coating with the single continuous layer of DLC) with the bottom plot of FIG. 7 (after coating with separated regions 23 of DLC). The much smaller amount of darker regions in the bottom plot of FIG. 7 compared with the bottom plot of FIG. 6 indicates improved flatness when separated regions 23 of DLC are used. In this particular experimental example the high internal stresses in the single continuous layer of DLC leads to bending and deformation of the substrate holder WT in which an outer edge of the substrate holder WT curls down by about 2.3 µm to 2.5 µm with respect to the center of the substrate holder WT. The deformation is considerably less where separated regions 23 of DLC are provided. The deviations in flatness observed when separated regions 23 of DLC are used are similar to those seen before any coating with DLC. More generally, the inventors have found experimentally that internal stresses in a single continuous layer of DLC with a thickness of the order to 1 micron can lead to micron-scale deformations in the substrate holder WT.

In the embodiment of FIG. 3, the layer of carbon based material (e.g. DLC) is provided in a plurality of separated, or disconnected, regions 23 of carbon based material (e.g. DLC). No carbon based material is provided in between these separated regions 23. The main body surface 22 of the substrate holder WT is thus exposed. The inventors have realized that during post processing of the substrate holder WT, for example during ion-beam figuring (IBF), material from the exposed SiSiC or SiC main body surface 22 of the substrate holder WT may be sputtered off as $SiO_x$ or SiC particles. Such particles may redeposit on top of the layer of carbon based material to form a contamination layer. This contamination layer increases the surface roughness of the distal end surfaces 20a of the burls 20 and leads to an increase in friction between the substrate holder WT and a substrate W. It is thus desirable to avoid the formation of such a contamination layer.

Figure 8:
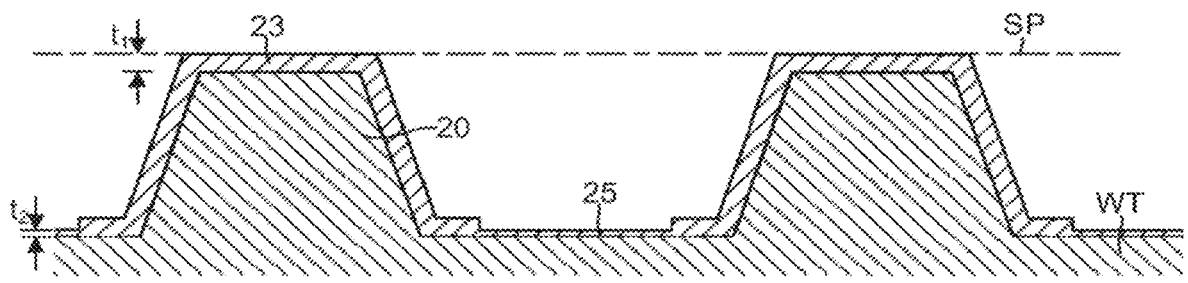
FIG. 8 depicts in cross-section burls of a substrate holder according to an alternative embodiment.

The inventors have found that the formation of such a contamination layer can be prevented or mitigated by providing a continuous layer of carbon based material, as depicted in FIG. 8. The continuous layer has a plurality of first regions 23. Each first region 23 has a first thickness $t_1$ (i.e. the same thickness). The first thickness $t_1$ is substantially uniform within each first region 23. The continuous layer further comprises at least one second region 25 having a second thickness $t_2$. The first thickness $t_1$ is larger than the second thickness $t_2$.

The plurality of first regions 23 together cover either only part of the distal end surface 20a of at least one of the burls 20, or both of at least a portion of the distal end surface 20a and at least a portion of the burl side surface 20b of at least one of the burls 20. In embodiments, the first regions 23 have the same sizes, shapes and/or positions as the separated regions 23 of carbon based material discussed above with reference to FIG. 3. The first regions 23 of carbon based material also provide a surface with a lower coefficient of friction than the main body surface 22 of the substrate holder WT and thereby reduce overlay errors in the same way as the separated regions 23 of carbon based material discussed above.

The provision of the at least one second region 25 having a lower thickness than the first regions 23 allows a continuous layer to be provided that achieves adequate resilience to wear at the same time as lower overall internal stresses in comparison to a continuous layer of uniform thickness. This is because thicknesses large enough to achieve the resilience to wear are not needed in areas that do not contact the substrate W. Providing the thinner second region 25 in at least some of the areas that do not contact the substrate W reduces internal stresses without having any negative impact on the resilience to wear. The internal stress per unit area in each second region 25 is lower than the internal stress per unit area in each first region 23.

In contrast to embodiments of the type discussed above within reference to FIG. 3, the provision of a continuous layer of the carbon based material (such that carbon based material is present between the first regions 23) ensures that no, or at least less, of the main body surface 22 of the substrate holder WT is exposed. Post-processing steps, such as ion-beam figuring, cannot act directly on the regions of the main body surface 22 of the substrate holder WT covered by the at least one second region 25 of carbon based material. Formation of a contamination layer on top of the layer of carbon based material during post-processing is prevented or reduced. The at least one second region 25 may cover all, or substantially all, of the area in between the plurality of first regions 23. This ensures that no part of the main body surface 22 is exposed to post-processing of the substrate holder WT, such that the risk of formation of a contamination layer is minimized.

In an embodiment, the at least one second region 25 connects the first regions 23 together to form a continuous layer over the main body surface 22 and burls 20 of the substrate holder WT. In an embodiment the first regions 23 and the at least one second region 25 are provided directly on the main body surface 22 and/or burls 20 of the substrate holder WT.

In various embodiments, the first thickness $t_1$ of carbon based material is selected to be in the range from 0.5 μm to 1.5 μm. Thicknesses of 0.5 μm and above of carbon based material (e.g. DLC) on top of the burls 20 have been found to provide adequate resilience to wear, to provide a practical margin for achieving flatness in post processing (such as ion-beam figuring or lapping), and to promote reliable full coverage of target surfaces. Thicknesses of 1.5 μm of carbon based material (e.g. DLC) and below have been found to provide internal stresses in the first regions 23 that are low enough so as not to contribute excessively to overlay errors.

In various embodiments, the second thickness $t_2$ of carbon based material is selected to be in the range from 200 nm to 300 nm. Thicknesses of 200 nm or higher have been found to reduce the risk that post processing steps (such as ion-beam figuring) penetrate to the main body surface 22 of a substrate holder WT, thereby reducing the risk that a contamination layer is formed. Thicknesses of less than 300 nm have been found effective to ensure that the internal stresses acting on the substrate holder WT are sufficiently reduced to avoid excessive curl down of the substrate holder WT edge and associated overlay errors.

The embodiment of FIG. 8 may be produced according to the method described in connection with FIG. 4, with the exception that in step S3 the carbon based material is only partially (rather than completely) removed from at least one selected region of the previously deposited continuous layer of carbon based material. The partial removal comprises reduction of the thickness of the carbon based material in the at least one selected region. Regions where the carbon based material has not been removed may form the first regions 23. The at least one region where the carbon based material has been partially removed may form the at least one second region 25. The partial removal may be implemented for example by etching or abrasive sand blasting through a mask (consisting, for example, of a photoresist or a metal), by electro-discharge machining, or by laser ablation.

Alternatively, the embodiment of FIG. 8 may be produced by first providing a thin continuous layer of carbon based material (e.g. equal to the second thickness, such as in the range from 200 nm to 300 nm). A thicker layer may then be added in selected regions to form the first regions 23 having the first thickness (e.g. in the range 0.5 μm to 1.5 μm), for example by adding carbon based material while preventing the carbon based material from forming on regions other than the first regions 23. This may be achieved, for example, by masking during deposition. In another embodiment the thicker first regions 23 are formed selectively in a first step (e.g. by masked deposition) and the at least one second region 25 is formed by applying a continuous thin layer in a subsequent step (over both the at least one second region 25 and the first regions 23).

Carbon based materials other than DLC may be provided on a substrate holder WT. One such alternative to DLC is graphene. Graphene may be used as a lubricant and wear resistive coating on the distal end surface 20a of the burls 20. A layer of graphene may thus be provided on a substrate holder WT as a friction-reducing and wear-resistant coating, to reduce the effect of undesirable overlay errors. The layer of graphene may be provided on the substrate support WT in a plurality of separated regions 23 of graphene, as described in relation to the embodiment of FIG. 3. This enables simple and efficient provision of high quality graphene on the substrate support WT. The quality of the graphene surface, as well as the quality of the interface between the graphene and the substrate holder WT, directly affects the graphene's resilience to wear and its low friction property.

The layer of graphene may comprise single-layer graphene or multi-layer graphene. The provision of single-layer graphene is sufficient dramatically to reduce wear of the substrate holder WT and friction between a substrate holder WT and a substrate W. As the layer of graphene is provided on the burls 20 of the substrate holder WT, direct atomic contact between the burls 20 and a substrate W supported by the burls 20 is avoided, such that chemical bonds leading to high friction and wear are not formed. Furthermore, the low defect density of graphene minimizes the adhesion force to a substrate W or to organic contaminations on the substrate W. The layer of graphene further compensates for any natural irregularities of the distal end surfaces 20a of the burls 20. Graphene has an intrinsic low surface energy, which minimizes the contribution to the friction force that is caused by pinning of capillary (or water) bridges on the burls 20. Such capillary bridges may stem from an immersion liquid used in the lithographic apparatus, or water vapor in air, and may increase the wear rate of a substrate holder WT significantly. Graphene thus effectively reduces or minimizes wear and the production of wear debris on the substrate holder WT. Graphene is an example of a carbon based material that significantly reduces the coefficient of friction and improves the resilience to wear of a substrate holder WT.

Providing multi-layer graphene, instead of single-layer graphene, may improve the resilience to wear of the layer of graphene. This is because wear is less likely to penetrate to the contact interface between the graphene and the substrate holder WT. As such, wear only minimally affects the adhesion of multi-layer graphene to a substrate holder WT.

A method of providing a substrate holder WT with a layer of graphene includes providing a substrate holder WT, submerging at least part of the substrate holder WT in a hydrogen atmosphere, and irradiating at least part of the substrate holder WT using a radiation beam B. The part of the substrate holder WT that is irradiated may correspond to the plurality of separated regions 23 of carbon based material discussed in relation to the embodiment of FIG. 3. The method may take place in a lithographic apparatus. The hydrogen atmosphere and the radiation beam may be provided by the lithographic apparatus.

The substrate holder WT may be made of SiSiC or SiC. Using a substrate holder WT made of SiC allows growth of graphene directly on the substrate holder WT. Furthermore, the homogeneous structure of a SiC substrate holder WT allows accurate definition of the mechanical contact properties of each burl 20 of the substrate holder WT. Graphene may be formed on SiC based on desorption of silicon atoms, which may for example occur at high temperatures. Graphene may thus be formed directly from the bulk material of the SiC substrate holder WT. Three SiC bilayers are needed to form one graphene layer. This is mediated by the formation of a carbon interlayer with a $(6\sqrt{3} \times 6\sqrt{3})R30°$ structure. Forming an additional graphene layer again leads to the formation of the $(6\sqrt{3} \times 6\sqrt{3})R30°$ structure. Simultaneously, the first $(6\sqrt{3} \times 6\sqrt{3})R30°$ structure is released from its covalent bonding to the SiC substrate holder WT and is transformed into a true graphene layer. In this way, all graphene layers are formed with the same 30° rotation with respect to the substrate holder WT.

Such growth of graphene on a SiC substrate holder WT may be achieved in situ within a lithographic apparatus. Selected regions of the substrate holder WT, or the whole substrate holder WT, may be exposed to the radiation beam B of a lithographic apparatus while the substrate holder WT is surrounded by a hydrogen atmosphere. The hydrogen atmosphere contains molecular hydrogen. This molecular hydrogen is dissociated into atomic hydrogen upon interaction with the radiation beam B. The chemical interaction of the silicon atoms of the SiC substrate holder WT and the atomic hydrogen leads to the formation of silane gas $SiH_4$, and thus the desorption of silicon. The carbon atoms remaining in the upper layers of the substrate holder WT after desorption of the silicon atoms reorganize themselves into the $(6\sqrt{3} \times 6\sqrt{3})R30°$ structure, and subsequently form a true graphene layer. The volatile $SiH_4$ can immediately be evacuated from the lithographic apparatus using vacuum equipment of the lithographic apparatus.

The wavelength of the radiation beam B is not critical. The wavelength of the radiation beam B can, for example, be in the visible (390 nm to 700 nm) or infrared (700 nm to 1 mm) regime. Alternatively, wavelengths of about 193 nm (DUV), about 13.5 nm (EUV) and even shorter wavelengths (BEUV) can be used, thus making it possible to use the DUV, EUV or other radiation beam B of a lithographic apparatus for the purpose of growing graphene. The radiation beam B may have a wavelength in the range from 5 nm to 1 mm. Preferably, the radiation beam B has a wavelength in the range from 10 nm to 200 nm. This will not result in excitation of inner shells of the C or Si of the SiC substrate holder WT. Radiation of this wavelength will result either in outer shell excitation and bond breaking, or in heating. Radiation of this wavelength effectively dissociates molecular hydrogen into atomic hydrogen. The lithographic apparatus may be an EUV lithographic apparatus, and the EUV radiation beam B of the EUV lithographic apparatus may be used to dissociate molecular hydrogen. Alternatively, the lithographic apparatus may be a DUV lithographic apparatus and the DUV radiation beam B of the DUV lithographic apparatus may be used to dissociate molecular hydrogen.

The pressure of the hydrogen atmosphere is not critical. The pressure may, for example, be in the order of 1 Pa or a few Pa, such as in the range from 0.5 Pa to 10 Pa. The pressure may correspond to the pressure in a lithographic apparatus, such that the hydrogen atmosphere is provided, for example, at a pressure of about 1 Pa. A pressure in the order of 1 Pa or a few Pa is sufficient to effectively enable graphene growth on a substrate holder WT. The pressure is low enough not to, or only minimally to, interfere in normal lithographic processing of the lithographic apparatus.

The exposure of graphene to a hydrogen atmosphere, such as in an EUV lithographic apparatus, may additionally be used for atomic level repair of graphene. A layer of graphene that is damaged, for example due to wear, is susceptible to rupture due to mechanical stresses. Dangling bonds are exposed at the damage site of the graphene. Hydrogen atoms may bond to and thus passivate these dangling bonds. This may significantly extend the lifetime of a layer of graphene, maintaining its desirable resilience to wear and friction properties for a longer period of time. Similarly, the hydrogen in water vapor, as for example present in a DUV lithographic apparatus, may bond and passivate dangling bonds of a layer of graphene, and thus extend the lifetime of the layer of graphene. As such, the layer of graphene on the substrate holder WT in an EUV or DUV lithographic apparatus may maintain its desirable properties for extended periods of time.

The layer of graphene on the substrate holder WT may wear down as substrates W are loaded onto and unloaded from the substrate holder WT. This reduces the substrate holder's WT low friction properties. The layer of graphene can periodically be renewed within a lithographic apparatus, for example when the coefficient of friction of the substrate holder WT exceeds a predetermined threshold. The layer of graphene may, for example, be renewed each time after loading and unloading of a single substrate W, or each time after loading and unloading of a predetermined number of substrates W. The frequency of renewal of the layer of graphene is dependent upon the wear rate of the layer of graphene. The layer of graphene is renewed when no substrate W is held by the substrate holder WT, for example after unloading of a substrate W from the substrate holder WT, and before a next substrate W is loaded onto the substrate holder WT. The process providing the layer of graphene may require a short time interval in which no lithographic processing takes place. However, it is expected that the frequency of renewal of the layer of graphene is sufficiently low not to interfere significantly in the lithographic processing of the lithographic apparatus.

An alternative method of providing the substrate holder WT with a layer of graphene includes providing the substrate holder WT, and irradiating at least part of the substrate holder WT using a laser beam. The part of the substrate holder WT that is irradiated may correspond to the plurality of separated regions 23 of carbon based material discussed above. The method may take place in situ in a lithographic apparatus.

The laser beam locally heats up the part of the substrate holder WT that is irradiated. The heated surface layers of SiC are decomposed into gaseous Si and solid C, such that Si is desorbed from the SiC substrate holder WT. The carbon atoms remaining in the upper layers of the substrate holder WT after desorption of the silicon atoms reorganize themselves into the $(6\sqrt{3}\times6\sqrt{3})R30°$ structure, and subsequently form a true graphene layer.

The laser beam may, for example, be a $CO_2$ laser beam. The wavelength of such a $CO_2$ laser beam may be in the range from 9.4 µm to 10.6 µm.

An advantage of this alternative method is that it does not require provision of a hydrogen atmosphere, and can thus more easily be performed in existing DUV lithographic apparatuses.

The above methods of providing a substrate holder WT with a layer of graphene have been described in relation to a SiC substrate holder. However, a layer of graphene may also be provided on a SiSiC substrate holder WT, comprising SiC grains in a Si matrix. The layer of graphene may be grown on the SiC grains of the substrate holder WT following desorption of Si atoms by one of the mechanisms described above. As such, the layer of graphene may be provided directly on the SiC grains. The SiC grains may be provided on the distal end surfaces 20*a* of the burls 20 of the substrate holder WT. As such, the layer of graphene may be provided only on part (only on the SiC grains) and not all (not the Si matrix holding the SiC grains) of the distal end surface 20*a* of the burls 20. The SiC grains are the part of the substrate holder WT that is in direct contact with a substrate W. It is thus especially desirable to improve the resilience to wear and the friction properties of the SiC grains of the substrate holder WT.

In a further alternative method of providing a substrate holder WT with a layer of graphene, the layer of graphene may be provided by mechanical exfoliation of graphene onto at least part of the substrate holder WT. Graphene may be mechanically exfoliated directly onto a SiC or SiSiC substrate holder WT, or a substrate holder WT with a DLC and a CrN coating. This makes provision of the layer of graphene on the substrate holder WT simple. The high structural homogeneity of a SiC substrate holder WT allows highly accurate shaping and polishing of the SiC burls, which allows graphene to be exfoliated onto the SiC burls with minimal surface defects.

Alternatively, an adhesion layer may be first provided on at least part of the substrate holder WT to improve adhesion of the graphene to the substrate holder WT. The part of the substrate holder WT that is provided with the adhesion layer may correspond to the plurality of separated regions 23 of carbon based material discussed in relation to the embodiment of FIG. 3. Applying an adhesion layer before providing the graphene may optimize the adhesion and surface properties of the graphene, and as such optimize its resilience to wear and friction properties.

Graphene may establish strong bonds with a broad range of materials with a variety of electronic structures, such as metals, dielectrics, semiconductors and composite materials. Graphene may chemically bond to metals and metal alloys, due to incompletely filled electronic d bands. The adhesion layer may thus be a metal or metal alloy, such as iron, cobalt, palladium, nickel, titanium or steel. Graphene may also electrostatically bond to dielectrics and semiconductors, due to its high charge density. Adhesion of graphene to a dielectric or a semiconductor increases with the dielectric constant $\varepsilon$ of the dielectric or semiconductor. The adhesion layer may have a dielectric constant $\varepsilon$ larger than 2.5. The adhesion layer may, for example, be selected from the group consisting of $Al_2O$ ($\varepsilon=9$), AlN ($\varepsilon=9$), $Cu_2O$ ($\varepsilon=18$), $Hf_2O$ ($\varepsilon=20\text{-}77$, depending on crystallography), a-$Zr_2O$ ($\varepsilon=22$), diamond ($\varepsilon=10$), DLC ($\varepsilon=2.5\text{-}6$), SiC ($\varepsilon=10$), or $Si_2O$ ($\varepsilon=4$).

The adhesion of graphene to $Hf_2O$ may be further improved by vacuum annealing. Graphene may additionally bond chemically to dielectrics or semiconductors such as DLC or SiC, further improving the adhesion of graphene to such materials. The adhesion of graphene to any of these materials may further be improved by applying a thin (e.g. atomic) chemical layer of adhesive solution to the substrate holder WT. The adhesive solution may be organic or inorganic. The adhesive solution may, for example, be ethylene-vinyl acetate or one of the inorganic materials listed above in relation to the adhesion layer.

The methods of providing graphene to a substrate holder WT described above allow a layer of graphene to be applied to selected regions on a substrate holder WT. These selected regions may correspond to the plurality of separated regions 23 of carbon based material described in relation to the embodiment of FIG. 3. Graphene may be applied selectively to the burls 20 that are most affected by wear and sliding of a substrate W, for example the outer burls 20 near the edge of the substrate holder WT. Selecting the regions on a substrate holder WT on which to apply graphene may also improve a substrate W load grid, as it allows local tuning of the friction force of each burl 20 of the substrate holder WT.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 436, 405, 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

The descriptions above are intended to be illustrative, not limiting. Thus, it will be apparent to one skilled in the art that modifications may be made to the invention as described without departing from the scope of the claims set out below.

The following clauses define preferred embodiments. The applicant reserves the right to pursue protection for the combinations of features set out in these clauses. The claims of this application are contained in a separate section from page 36 onwards and headed "Claims".

Clause 1: A substrate holder for use in a lithographic apparatus and configured to support a substrate, the substrate holder comprising:
    a main body having a main body surface;
    a plurality of burls projecting from the main body surface, wherein
        each burl has a burl side surface and a distal end surface, wherein the distal end surface is configured to engage with the substrate;
        the distal end surfaces of the burls substantially conform to a support plane and are configured for supporting the substrate;
    wherein
        a layer of diamond-like carbon is provided in a plurality of separated regions of diamond-like carbon; and
        the layer of diamond-like carbon covers the distal end surface and at least a portion of the burl side surface of at least one of the burls.

Clause 2: The substrate holder of clause 1, wherein the layer of diamond-like carbon covers the burl side surface, the distal end surface, and a portion of the main body surface directly adjacent to the burl side surface, of at least one of the burls.

Clause 3: The substrate holder of clause 1 or 2, wherein each of one or more of the plurality of separated regions of diamond-like carbon covers a portion of the burl side surface and the distal end surface of a single burl.

Clause 4: The substrate holder of clause 3, wherein each of the separated regions of diamond-like carbon that covers a portion of the burl side surface and the distal end surface of a single burl has, when viewed perpendicularly to the main body surface, a maximum lateral dimension that is less than the distance between the center of the burl and the center of a nearest other burl.

Clause 5: The substrate holder of any preceding clause, wherein the layer of diamond-like carbon covers the distal end surface of each of the plurality of burls projecting from the main body surface.

Clause 6: The substrate holder of clause 5, wherein the layer of diamond-like carbon further covers at least part of the burl side surface of each of the plurality of burls projecting from the main body surface.

Clause 7: The substrate holder of any preceding clause, wherein the layer of diamond-like carbon has a thickness in the range from 0.5 µm to 1.5 µm.

Clause 8: The substrate holder of any of clauses 1-6, wherein the layer of diamond-like carbon has a thickness in the range from 30 nm to 200 nm.

Clause 9: The substrate holder of any preceding clause, further comprising a seal projecting from the main body surface, the seal having a seal end surface,
    wherein the layer of diamond-like carbon covers the seal end surface.

Clause 10: The substrate holder of any preceding clause, wherein the plurality of separated regions of diamond-like carbon are formed by selectively removing regions of diamond-like carbon from a previously deposited layer of diamond-like carbon.

Clause 11: A method of manufacturing a substrate holder, the method comprising:
    providing a substrate holder blank having a main body with a main body surface, and having a plurality of burls projecting from the main body surface, wherein each burl has a burl side surface and a distal end surface, wherein the distal end surface is configured to engage with a substrate and the distal end surfaces of the burls substantially conform to a support plane and are configured for supporting a substrate;
    providing a layer of diamond-like carbon in a plurality of separated regions of diamond-like carbon, the plurality of separated regions being positioned such that the layer of diamond-like carbon covers the distal end surface and a portion of the burl side surface of at least one of the burls.

Clause 12: The method of clause 11, wherein the providing of the layer of diamond-like carbon comprises:
    providing a continuous layer of diamond-like carbon on at least part of the main body surface and the plurality of burls; and selectively removing regions of diamond-like carbon from the continuous layer of diamond-like carbon to form the plurality of separated regions of diamond-like carbon.

Clause 13: The method of clause 11, wherein the providing of the layer of diamond-like carbon comprises:
providing a layer of diamond-like carbon while selectively preventing the layer of diamond-like carbon from forming on regions other than the plurality of separated regions of diamond-like carbon, thereby forming the plurality of separated regions of diamond-like carbon.

Clause 14: A lithographic apparatus for projecting an image onto a substrate, the lithographic apparatus comprising:
a substrate holder configured to support the substrate according to any of clauses 1 to 10.

Clause 15: The lithographic apparatus of clause 14, further comprising:
a support structure configured to support a patterning device;
a projection system arranged to project a beam patterned by the patterning device onto the substrate; and
a clamp system for clamping the substrate to the substrate holder.

Clause 16: A method of manufacturing devices using a lithographic apparatus having the substrate holder of any of clauses 1 to 10 and a clamp system for clamping a substrate to the substrate holder, the method comprising:
loading a substrate onto the substrate holder;
allowing a deformation of the substrate to relax;
engaging the clamp system; and
exposing a pattern onto the substrate.

Clause 17: A substrate holder for use in a lithographic apparatus and configured to support a substrate, the substrate holder comprising:
a main body having a main body surface;
a plurality of burls projecting from the main body surface, wherein
each burl has a burl side surface and a distal end surface, wherein the distal end surface is configured to engage with the substrate;
the distal end surfaces of the burls substantially conform to a support plane and are configured for supporting the substrate;
wherein
a layer of carbon based material is provided in a plurality of separated regions of carbon based material, the layer of carbon based material providing a surface with a lower coefficient of friction than a part of the main body surface outside the plurality of separated regions of carbon based material; and
the layer of carbon based material covers only part of the distal end surface of at least one of the burls, or the layer of carbon based material covers the distal end surface and at least a portion of the burl side surface of at least one of the burls.

Clause 18: The substrate holder of clause 17, wherein the carbon based material is diamond-like carbon.

Clause 19: The substrate holder of clause 17 or 18, wherein the layer of carbon based material covers the burl side surface, the distal end surface, and a portion of the main body surface directly adjacent to the burl side surface, of at least one of the burls.

Clause 20: The substrate holder of any of clauses 17 to 19, wherein each of one or more of the plurality of separated regions of carbon based material covers a portion of the burl side surface and the distal end surface of a single burl.

Clause 21: The substrate holder of clause 20, wherein each of the separated regions of carbon based material that covers a portion of the burl side surface and the distal end surface of a single burl has, when viewed perpendicularly to the main body surface, a maximum lateral dimension that is less than the distance between the center of the burl and the center of a nearest other burl.

Clause 22: The substrate holder of any of clauses 17-21, wherein the layer of carbon based material covers the distal end surface of each of the plurality of burls projecting from the main body surface.

Clause 23: The substrate holder of clause 22, wherein the layer of carbon based material further covers at least part of the burl side surface of each of the plurality of burls projecting from the main body surface.

Clause 24: The substrate holder of any of clauses 17-23, wherein the layer of carbon based material has a thickness in the range from 0.5 µm to 1.5 µm.

Clause 25: The substrate holder of any of clauses 17-23, wherein the layer of carbon based material has a thickness in the range from 30 nm to 200 nm.

Clause 26: The substrate holder of any of clauses 17-25, further comprising a seal projecting from the main body surface, the seal having a seal end surface,
wherein the layer of carbon based material covers the seal end surface.

Clause 27: The substrate holder of any of clauses 17-26, wherein the plurality of separated regions of carbon based material are formed by selectively removing regions of carbon based material from a previously deposited layer of carbon based material.

Clause 28: A method of manufacturing a substrate holder, the method comprising:
providing a substrate holder blank having a main body with a main body surface, and having a plurality of burls projecting from the main body surface, wherein each burl has a burl side surface and a distal end surface, wherein the distal end surface is configured to engage with a substrate and the distal end surfaces of the burls substantially conform to a support plane and are configured for supporting a substrate;
providing a layer of carbon based material in a plurality of separated regions of carbon based material, the layer of carbon based material providing a surface with a lower coefficient of friction than a part of the main body surface outside the plurality of separated regions of carbon based material, and the plurality of separated regions being positioned such that the layer of carbon based material covers only part of the distal end surface of at least one of the burls, or the layer of carbon based material covers the distal end surface and a portion of the burl side surface of at least one of the burls.

Clause 29: The method of clause 28, wherein the providing of the layer of carbon based material comprises:
providing a continuous layer of carbon based material on at least part of the main body surface and the plurality of burls; and
selectively removing regions of carbon based material from the continuous layer of carbon based material to form the plurality of separated regions of carbon based material.

Clause 30: The method of clause 28, wherein the providing of the layer of carbon based material comprises:
providing a layer of carbon based material while selectively preventing the layer of carbon based material from forming on regions other than the plurality of separated regions of carbon based material, thereby forming the plurality of separated regions of carbon based material.

Clause 31: A substrate holder for use in a lithographic apparatus and configured to support a substrate, the substrate holder comprising:
a main body having a main body surface;
a plurality of burls projecting from the main body surface, wherein
each burl has a burl side surface and a distal end surface, wherein the distal end surface is configured to engage with the substrate;
the distal end surfaces of the burls substantially conform to a support plane and are configured for supporting the substrate;
wherein
a continuous layer of carbon based material is provided, the continuous layer comprising a plurality of first regions each having a first thickness and at least one second region having a second thickness, the carbon based material providing a surface with a lower coefficient of friction than the main body surface,
the plurality of first regions together either cover only part of the distal end surface of at least one of the burls, or cover the distal end surface and at least a portion of the burl side surface of at least one of the burls, and
the first thickness is larger than the second thickness.

Clause 32: The substrate holder of clause 31, wherein the first thickness is in the range from 0.5 μm to 1.5 μm, and the second thickness is in the range from 200 nm to 300 nm.

Clause 33: A lithographic apparatus for projecting an image onto a substrate, the lithographic apparatus comprising:
a substrate holder configured to support the substrate according to any of clauses 17 to 27 or 31 to 32.

Clause 34: The lithographic apparatus of clause 33, further comprising:
a support structure configured to support a patterning device;
a projection system arranged to project a beam patterned by the patterning device onto the substrate; and
a clamp system for clamping the substrate to the substrate holder.

Clause 35: A method of manufacturing devices using a lithographic apparatus having the substrate holder of any of clauses 17 to 27 or 31 to 32 and a clamp system for clamping a substrate to the substrate holder, the method comprising:
loading a substrate onto the substrate holder;
allowing a deformation of the substrate to relax;
engaging the clamp system; and
exposing a pattern onto the substrate.

The invention claimed is:

1. A substrate holder for use in a lithographic apparatus and configured to support a substrate, the substrate holder comprising:
a main body having a main body surface;
a plurality of burls projecting from the main body surface, wherein
each burl has a burl side surface and a distal end surface, wherein the distal end surface is configured to engage with the substrate;
the distal end surfaces of the burls substantially conform to a support plane and are configured for supporting the substrate;
wherein
a continuous layer of carbon based material is provided, the continuous layer comprising a plurality of first regions each having a first thickness and at least one second region having a second thickness, the carbon based material providing a surface with a lower coefficient of friction than the main body surface, the plurality of first regions together covering a surface portion of at least one of the burls, the first thickness being larger than the second thickness, and the second thickness being less than 300 nm.

2. The substrate holder of claim 1 wherein the plurality of first regions covers only part of the distal end surface of at least one of the burls.

3. The substrate holder of claim 2, wherein the first thickness is in the range from 0.5 μm to 1.5 μm, and the second thickness is in the range from 200 nm to 300 nm.

4. The substrate holder of claim 1 wherein the plurality of first regions covers the distal end surface and at least a portion of the burl side surface of at least one of the burls.

5. The substrate holder of claim 4, wherein the first thickness is in the range from 0.5 μm to 1.5 μm, and the second thickness is in the range from 200 nm to 300 nm.

6. The substrate holder of claim 1 wherein the carbon based material is diamond-like carbon.

7. The substrate holder of claim 2 wherein the carbon based material is diamond-like carbon.

8. The substrate holder of claim 3 wherein the carbon based material is diamond-like carbon.

9. The substrate holder of claim 1 wherein each of the plurality of first regions covers the burl side surface, the distal end surface, and a portion of the main body surface directly adjacent to the burl side surface, of at least one of the burls.

10. The substrate holder of claim 1 wherein each of one or more of the plurality of first regions covers a portion of the burl side surface and the distal end surface of a single burl.

11. The substrate holder of claim 10, wherein each of the plurality of first regions that covers a portion of the burl side surface and the distal end surface of a single burl has, when viewed perpendicularly to the main body surface, a maximum lateral dimension that is less than the distance between the center of the burl and the center of a nearest other burl.

12. The substrate holder of claim 1 wherein the plurality of first regions covers the distal end surface of each of the plurality of burls projecting from the main body surface.

13. The substrate holder of claim 1 further comprising a seal projecting from the main body surface, the seal having a seal end surface, wherein the plurality of first regions covers the seal end surface.

14. A substrate holder for use in a lithographic apparatus and configured to support a substrate, the substrate holder comprising:
a main body having a main body surface;
a plurality of burls projecting from the main body surface, wherein
each burl has a burl side surface and a distal end surface, wherein the distal end surface is configured to engage with the substrate;
the distal end surfaces of the burls substantially conforming to a support plane and being configured for supporting the substrate;
wherein
a layer of carbon based material is provided in a plurality of separated regions of carbon based material, the layer of carbon based material providing a surface with a lower coefficient of friction than a part of the main body surface outside the plurality of separated regions of carbon based material; and the layer of carbon based material covers the distal end surface and at least a portion of the burl side surface of at least one of the burls, and wherein each of the separated regions is provided on multiple burls.

15. The substrate holder of claim 14, wherein the layer of carbon based material has a thickness in the range from 0.5 µm to 1.5 µm.

16. A substrate holder for use in a lithographic apparatus and configured to support a substrate, the substrate holder comprising:
a main body having a main body surface;
a plurality of burls projecting from the main body surface, wherein
each burl has a burl side surface and a distal end surface, wherein the distal end surface is configured to engage with the substrate;
the distal end surfaces of the burls substantially conforming to a support plane and being configured for supporting the substrate;
wherein
a layer of carbon based material is provided in a plurality of separated regions of carbon based material, the layer of carbon based material providing a surface with a lower coefficient of friction than a part of the main body surface outside the plurality of separated regions of carbon based material; and
the layer of carbon based material covers only part of the distal end surface of at least one of the burls, wherein the layer of carbon based material has a thickness in the range from 0.5 µm to 1.5 µm.

17. A substrate holder for use in a lithographic apparatus and configured to support a substrate, the substrate holder comprising:
a main body having a main body surface;
a plurality of burls projecting from the main body surface, wherein
each burl has a burl side surface and a distal end surface, wherein the distal end surface is configured to engage with the substrate;
the distal end surfaces of the burls substantially conforming to a support plane and being configured for supporting the substrate;
wherein
a layer of carbon based material is provided as a plurality of separated regions of carbon based material, the layer of carbon based material providing a surface with a lower coefficient of friction than a part of the main body surface outside the plurality of separated regions of carbon based material; and
the layer of carbon based material covers only part of the distal end surface of at least one of the burls, wherein the carbon based material comprises graphene.

18. The substrate holder of claim 17 wherein each burl comprises a plurality of SiC grains in a silicon matrix, and the part of the distal end surface of each burl that is covered by the carbon based material comprises surfaces of SiC grains on the distal end surface of the burl.

19. A method of manufacturing a substrate holder, the method comprising:
providing a substrate holder blank having a main body with a main body surface, and having a plurality of burls projecting from the main body surface, wherein each burl has a burl side surface and a distal end surface, wherein the distal end surface is configured to engage with a substrate and the distal end surfaces of the burls substantially conform to a support plane and are configured for supporting a substrate;
providing a continuous layer of carbon based material, the continuous layer comprising a plurality of first regions each having a first thickness and at least one second region having a second thickness, the layer of carbon based material providing a surface with a lower coefficient of friction than the main body surface,
wherein the providing of the continuous layer of carbon based material comprises:
providing a layer of carbon based material having the first thickness on at least part of the main body surface and the plurality of burls; and
selectively reducing the thickness of the carbon based material in the at least one second region to form the continuous layer of carbon based material.

20. A method of manufacturing a substrate holder, the method comprising:
providing a substrate holder having a main body with a main body surface, and having a plurality of burls projecting from the main body surface, wherein each burl has a burl side surface and a distal end surface, wherein the distal end surface is configured to engage with a substrate and the distal end surfaces of the burls substantially conform to a support plane and are configured for supporting a substrate;
submerging at least part of the substrate holder in a hydrogen atmosphere;
irradiating a plurality of separated regions on the at least part of the substrate holder using a radiation beam so as to form a layer of graphene in the plurality of separated regions, the plurality of separated regions being positioned such that the layer of graphene covers only part of the distal end surface of at least one of the burls.

* * * * *